(12) United States Patent
Nataraj et al.

(10) Patent No.: US 8,031,501 B1
(45) Date of Patent: Oct. 4, 2011

(54) SEGMENTED CONTENT ADDRESSABLE MEMORY DEVICE HAVING PIPELINED COMPARE OPERATIONS

(75) Inventors: Bindiganavale S. Nataraj, Cupertino, CA (US); Chetan Deshpande, San Jose, CA (US); Vinay Iyengar, Cupertino, CA (US); Sandeep Khanna, Los Altos, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/909,714

(22) Filed: Oct. 21, 2010

(51) Int. Cl.
*G11C 15/00* (2006.01)

(52) U.S. Cl. .................. 365/49.1; 365/49.17; 365/49.18

(58) Field of Classification Search .................. 365/49.1, 365/49.17, 49.18
See application file for complete search history.

(56) References Cited

U.S. PATENT DOCUMENTS

| | | | |
|---|---|---|---|
| 6,125,049 A | 9/2000 | Nataraj | |
| 6,147,891 A | 11/2000 | Nataraj | |
| 6,166,939 A | 12/2000 | Nataraj et al. | |
| 6,191,969 B1 | 2/2001 | Pereira | |
| 6,191,970 B1 | 2/2001 | Pereira | |
| 6,243,280 B1 | 6/2001 | Wong et al. | |
| 6,430,074 B1 | 8/2002 | Srinivasan | |
| 6,470,418 B1 | 10/2002 | Lien et al. | |
| 6,697,276 B1 | 2/2004 | Pereira et al. | |
| 6,760,242 B1 | 7/2004 | Park et al. | |
| 6,804,133 B1 | 10/2004 | Khanna | |
| 6,865,098 B1 * | 3/2005 | Ichiriu et al. | 365/49.15 |
| 6,867,991 B1 | 3/2005 | Tezcan et al. | |
| 6,965,519 B1 | 11/2005 | Park et al. | |
| 6,967,856 B1 | 11/2005 | Park et al. | |
| 7,050,318 B1 | 5/2006 | Argyres | |
| 7,113,415 B1 | 9/2006 | Khanna | |
| 7,219,188 B1 | 5/2007 | Pereira | |
| 7,251,707 B1 | 7/2007 | Pereira | |
| 7,325,091 B2 | 1/2008 | Pereira | |
| 7,694,068 B1 | 4/2010 | Rosman | |
| 7,800,930 B1 | 9/2010 | Deshpande et al. | |
| 7,848,129 B1 | 12/2010 | Deshpande et al. | |
| 7,852,652 B1 | 12/2010 | Fabry | |

\* cited by examiner

*Primary Examiner* — Jason Lappas
(74) *Attorney, Agent, or Firm* — Mahamedi Paradice Kreisman LLP; William L. Paradice, III

(57) ABSTRACT

Present embodiments describe a CAM device having a segmented CAM array. Each segment of the CAM array, or cell blocks, includes one or more rows of CAM cells. One or more of the cell blocks in the CAM array are selectively enabled during a search operation based on a detected matching condition of another cell block. By selectively enabling cell blocks during search operations only when needed, energy consumption is reduced. Selectively enabling a cell block includes selectively pre-charging match lines to the cell block, selectively enabling word lines to the cell block, and selectively enabling comparand line to the cell block. In accordance with certain embodiments, the CAM device is configurable to perform search operations in a pipelined manner. Accordingly, the CAM device is capable of performing multiple search operations simultaneously.

15 Claims, 8 Drawing Sheets

SEGMENTED CONTENT ADDRESSABLE MEMORY DEVICE HAVING PIPELINED COMPARE OPERATIONS

TECHNICAL FIELD

This disclosure relates generally to content addressable memory (CAM) devices and specifically to power saving techniques in CAM devices achieved through selectively enabling or disabling blocks of CAM cells during a search operation.

BACKGROUND OF RELATED ART

Content addressable memory (CAM) devices are frequently used in network switching and routing applications to determine forwarding destinations for data packets, and are also used to provide more advanced network Quality of Service (QoS) functions such as traffic shaping, traffic policing, rate limiting, and so on. More recently, CAM devices have been deployed in network environments to implement intrusion detection systems and to perform deep packet inspection tasks.

A CAM device can be instructed to compare a selected portion of an incoming packet with CAM words stored in an array within the CAM device. More specifically, a CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match result, which is typically stored in a match latch associated with the matching CAM row. If one or more of the match lines are asserted, a match flag is asserted to indicate the match condition, and a priority encoder determines the match address or index of the highest priority matching (HPM) entry in the CAM array.

FIG. 1 is a block diagram of a typical CAM device. CAM device 100 includes a CAM array 110, an address decoder 120, a comparand register 130, a read/write circuit 140, a priority encoder circuit 150, and match logic 160. CAM array 110 includes any number of rows of CAM cells (not shown for simplicity in FIG. 1), where each row of CAM cells can be configured to store a data word. Further, while CAM array 110 is shown in FIG. 1 as a single CAM array, it may include any number of CAM array blocks that can be independently searched.

One or more instructions and related control signals may be provided to CAM device 100 from an instruction decoder (not shown for simplicity) to control read, write, compare, and other operations for CAM device 100. Other well-known signals that can be provided to CAM device 100, such as enable signals, clock signals, and power connections, are not shown for simplicity. Further, although not shown in FIG. 1, each row of CAM cells in CAM array 110 may have one or more validity bits to indicate whether the corresponding row (or any segment thereof) of CAM cells stores valid data.

Each row of CAM cells (not shown in FIG. 1 for simplicity) in CAM array 110 is coupled to address decoder 120 via a corresponding word line WL, and to match latches 112, to priority encoder 150, and to well-known match logic 160 via a corresponding match line ML. For simplicity, the word lines and match lines are represented collectively in FIG. 1. Address decoder 120 is well-known, and includes circuitry to select corresponding rows in CAM array 110 for read, write, and/or other operations in response to an address received from an address bus ABUS using the word lines WL. For other embodiments, addresses may be provided to address decoder 120 from another suitable bus and/or circuitry.

The match lines ML provide match results for compare operations between comparand data (e.g., a search key) and data stored in CAM array 110. Priority encoder 150, which is well-known, uses the match results indicated on the match lines and latches in the match latches 112 to determine the matching entry that has the highest priority number associated with it and generates the index or address of this highest priority match (HPM). In addition, priority encoder 150 may use the validity bits from CAM array 110 to generate the next free address that is available in CAM array 110 for storing new data. Although not shown in FIG. 1, for some embodiments, priority encoder 150 may provide the next free address to the address decoder 120.

Match logic 160, which is well-known, uses the match results indicated on the match lines to generate a match flag indicative of a match condition in CAM array 110. If there is more than one matching entry in CAM array 110, match logic 160 may generate a multiple match flag to indicate a multiple match condition. In addition, match logic 160 may use the validity bits from CAM array 110 to assert a full flag when all of the rows of CAM cells in CAM array 110 are filled with valid entries.

Each column of CAM cells (not shown in FIG. 1 for simplicity) in CAM array 110 is coupled to comparand register 130 via one or more corresponding comparand lines CL, and is coupled to read/write circuit 140 via one or more corresponding bit lines BL. For simplicity, the comparand lines CL and bit lines BL are represented collectively in FIG. 1. Comparand register 130 is well-known, and is configured to provide a search key (e.g., a comparand word) received from a comparand bus CBUS to CAM array 110 during compare operations with data stored therein. For other embodiments, the search key can be provided to CAM array 110 via another bus and/or circuit. Read/write circuit 140 includes well-known write drivers to write data received from a data bus DBUS to CAM array 110 via the bit lines, and includes well-known sense amplifiers to read data from CAM array 110 onto DBUS. For other embodiments, read/write circuit 140 may be coupled to a bus other than DBUS. Further, although not shown in FIG. 1 for simplicity, CAM device 100 can include a well-known global mask circuit (e.g., coupled to the comparand register 130) that can selectively mask the bits of the search key provided to the CAM array 110.

FIG. 2 is a more detailed block diagram of the CAM array 110 of FIG. 1. CAM array 110 is shown to include a plurality of CAM cells 202 organized in any number of rows and columns. The CAM cells 202 can be any suitable type of CAM cell including, for example, binary CAM cells, ternary CAM cells, and/or quaternary CAM cells. As noted above, each row of CAM array 110 may also include one or more validity bits. Each row of CAM cells 202 is coupled to a match line ML and to a word line WL. Each word line WL is driven by address decoder 120 (see also FIG. 1) to select one or more rows of CAM cells 202 for writing or reading. Each match line ML is coupled to priority encoder 150 via a corresponding match latch 212, which together form the match latches 112 of FIG. 1. Each column of CAM cells 202 in CAM array 110 is coupled to read/write circuit 140 via a complementary bit line pair BL/BLB, and to comparand register 130 via a complementary comparand line pair CL/CLB.

Prior to compare operations, the match lines are pre-charged (e.g., to logic high), and each set of complementary comparand line pairs CL/CLB are driven to the same predetermined logic level (e.g., to logic high). Then, during compare operations, the comparand register provides the search key (i.e., the comparand word) to the CAM cells 202 by driving each pair of complementary comparand lines CL/CLB to opposite logic states indicative of the corresponding bit of the search key. For example, to provide a logic low comparand bit to a column of CAM cells, the corresponding comparand line CL is driven to a first logic state (e.g., logic low) and the corresponding complementary comparand line CLB is driven to a second logic state (e.g., logic high); conversely, to provide a logic high comparand bit to the column of CAM cells, the corresponding comparand line CL is driven to the second logic state (e.g., logic high) and the corresponding complementary comparand line CLB is driven to the first logic state (e.g., logic low). Thereafter, if all the CAM cells 202 in a particular row match the corresponding bits of the search key, then the match line ML remains in its logic high state to indicate the match condition. Conversely, if one or more of the CAM cells 202 in the row do not match the corresponding bit of the search key, then mismatching CAM cells 202 discharge the match line (e.g., to ground potential) to indicate the mismatch condition.

Because at least one of each comparand line pair CL/CLB in the CAM array 110 is charged and discharged for every compare operation, power consumption associated with charging and discharging the comparand lines can be significant. Accordingly, there is a need to minimize the power consumption associated with the pre-charging and discharging of the comparand lines in CAM arrays.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

Figure 1:
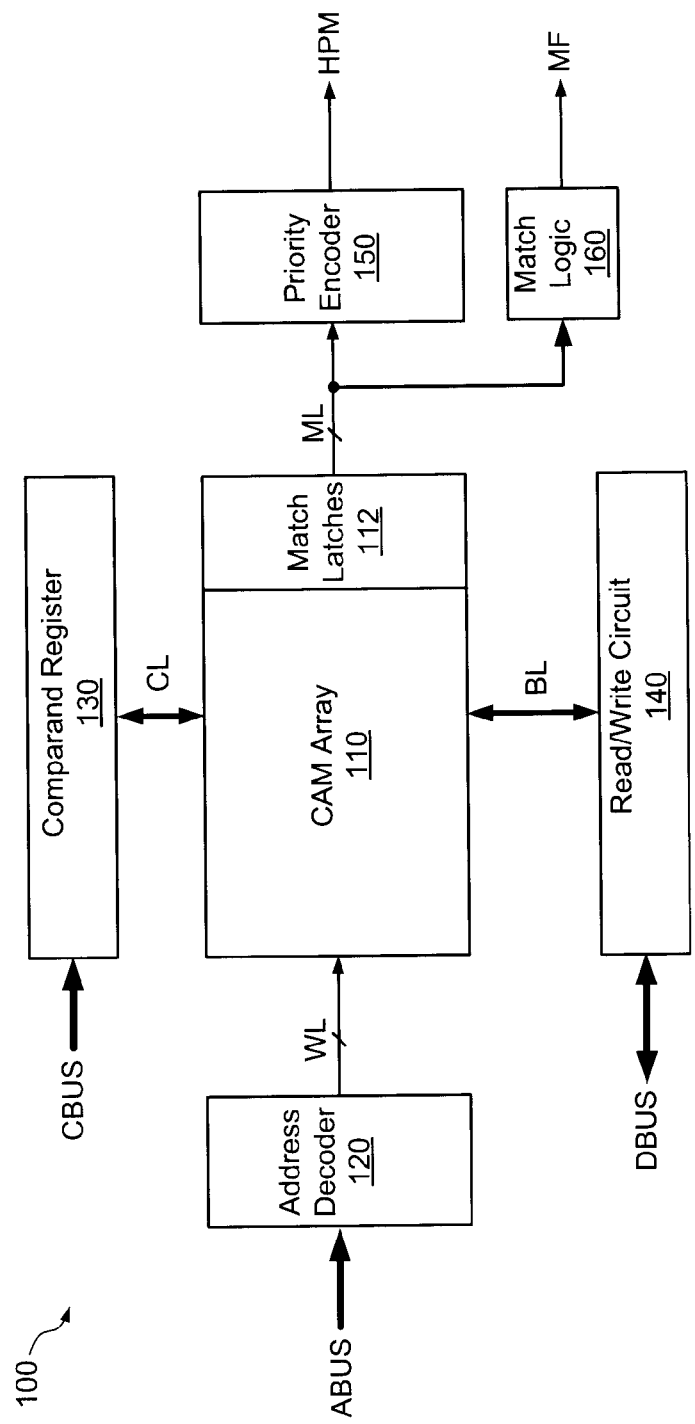
FIG. 1 shows a block diagram of a content addressable memory (CAM) device.
Figure 2:
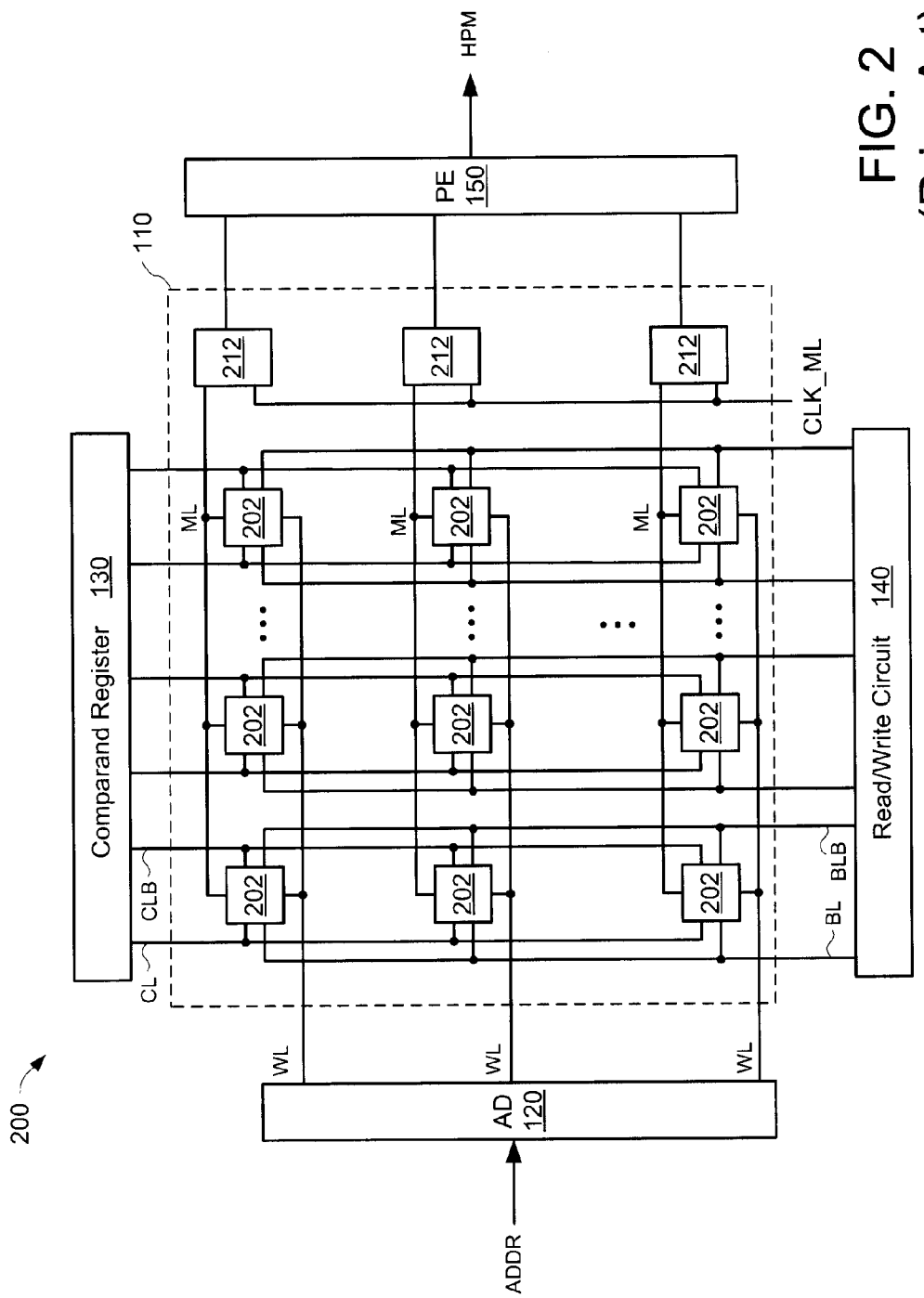
FIG. 2 shows a more detailed block diagram of the CAM array of FIG. 1.

A method and apparatus for reducing power consumption and capacitive loading in a CAM device is disclosed. In the following description, for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather includes within its scope all embodiments defined by the appended claims.

Present embodiments minimize power consumption of a CAM device by dividing the CAM array into a plurality of CAM blocks, segmenting the comparand lines along the CAM block boundaries, and selectively enabling successive CAM blocks for compare operations in response to match conditions in one or more previous CAM blocks. Thus, rather than having comparand lines that extend across the entire height of the CAM array, CAM arrays in accordance with the present embodiments include a plurality of sets of pipelined comparand line segments, wherein each set of pipelined comparand line segments extends across only the rows of the corresponding CAM block. During compare operations, only the sets of comparand line segments associated with the enabled CAM blocks are driven with the search key, thereby minimizing power consumption by not charging/discharging the set of comparand line segments associated with the other CAM blocks in response to the search key.

More specifically, present embodiments perform compare operations in selected iterations across successive CAM blocks in the CAM array according to descending priority, wherein the first CAM block (e.g., having the lowest indices or physical addresses) is assigned the highest priority, the second CAM block (e.g., having the second lowest indices or physical addresses) is assigned the second highest priority, and so on, where the last CAM block (e.g., having the highest indices or physical addresses) is assigned the lowest priority. For some embodiments, the search key is initially provided only to the first set of comparand line segments and compared with data stored in the corresponding first CAM block. If there is a match condition in the first CAM block, the index of the highest-priority matching (HPM) location is generated, and the compare operation is completed because any other potentially matching location in subsequent CAM blocks would be of a lower priority. Conversely, if there is not a match in the first CAM block, then the search key is provided to the second set of comparand line segments and compared with data stored the second CAM block. If there is a match condition in the second CAM block, the index of the highest-priority matching (HPM) location is generated, and the compare operation is completed because any other potentially matching location in subsequent CAM blocks would be of a lower priority. If there is not a match, the search key is provided to the next CAM block, and on so, until either a match is detected or the entire CAM array has been searched without finding a match. In this manner, only a minimal number of sets of comparand line segments are charged and discharged for each compare operation, thereby advantageously reducing power consumption associated with the comparand lines.

For some embodiments, the search operations are pipelined to enable the CAM device to perform a plurality of pipelined search operations at once.

Figure 3:
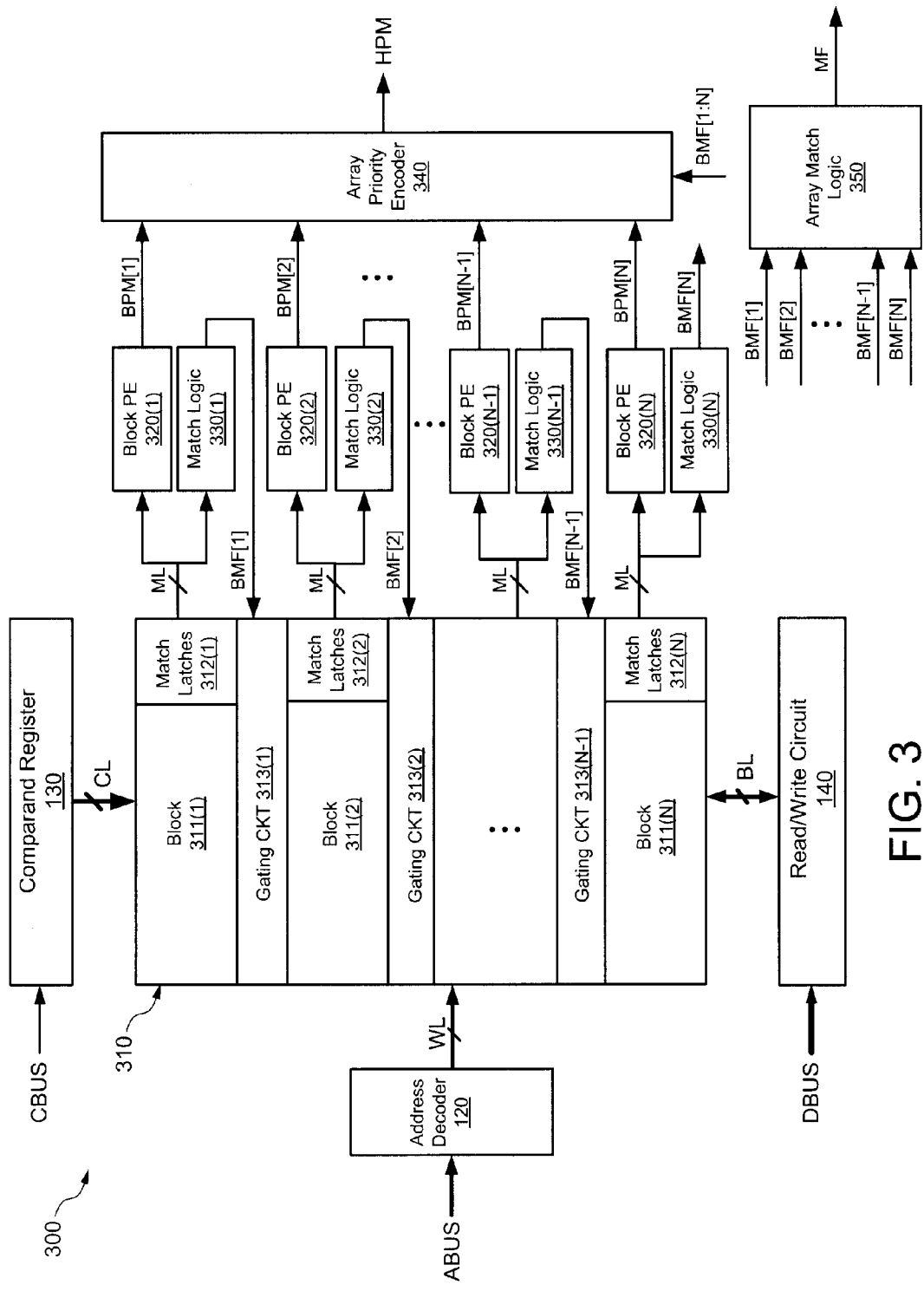
FIG. 3 shows a block diagram of a segmented CAM device according to some of the present embodiments.

FIG. 3 shows a block diagram of a CAM device 300 in accordance with some embodiments. CAM device 300 includes a segmented CAM array 310, address decoder 120, comparand register 130, read/write circuit 140, block priority encoders 320(1)-320(N), match logic circuits 330(1)-330(N), an array priority encoder 340, and an array match logic 350. The segmented CAM array 310 is coupled to address decoder 120 via word lines WL, to comparand register 130 via comparand lines CL, and to read/write circuit 140 via bit lines BL. Comparand lines CL and bit lines BL each include any number of pairs of complimentary signal lines (not shown for simplicity in FIG. 3). Address decoder 120, comparand register 130, and read/write circuit 140 operate in the same manner as described above with respect to FIG. 1.

Segmented CAM array 310 includes a number of CAM blocks 311(1)-311(N), match latches 312(1)-312(N), and comparand line gating circuits 313(1)-313(N−1), where N is an integer greater than 1. Each CAM block 311 is associated with a corresponding block priority encoder 320 and a corresponding match logic circuit 330, and includes an array of CAM cells (not shown in FIG. 3 for simplicity) arranged in a number X of rows and a number Y of columns. The rows of CAM cells within each block 311 are coupled to corresponding match latches 312, a corresponding block priority encoder 320, and a corresponding match logic circuit 330 via an associated set of match lines ML that indicate match results during compare operations with a search key. The columns of CAM cells within each CAM block 311 are coupled to corresponding comparand line segments (not shown in FIG. 3 for simplicity) that selectively provide bits of the search key to the CAM block 311 during compare operations. The comparand line segments in adjacent CAM blocks 311 are selectively connected together by the gating circuits 313. Thus, each column of CAM cells in the array 310 includes a number N of comparand line segments that can be selectively connected together (e.g., in a sequential manner) by the gating circuits 313. In this manner, the search key can be selectively provided from the comparand register 130 to successive CAM blocks 311(1)-311(N) during pipelined compare operations, as described in more detail below.

Each block priority encoder 320 uses the match signals provided on the associated set of match lines ML to generate a block priority match index (BPM) that indicates the index (e.g., row address) of the highest priority matching row in the corresponding CAM block 311. For exemplary embodiments described herein, the row that has the lowest index or physical address is designated as the highest-priority row, although for some embodiments the order of priority can be reversed or otherwise modified. The BPM indices generated by the block priority encoders 320(1)-320(N) are logically combined by the array priority encoder 340 to generate a highest priority match (HPM) signal that indicates which matching CAM row in the entire array 310 has the highest priority address associated with it.

Each match logic circuit 330 uses the match signals provided on the associated set of match lines ML to generate a block match flag (BMF) indicating whether a match condition is detected in the corresponding CAM block 311. The BMF signals generated by the match logic circuits 330(1)-330(N) are logically combined by the array match logic circuit 350 to generate an array match flag signal (MF) indicating whether a match is detected within any portion of the CAM array 310. For some embodiments, the block match flags (BMF) generated by the match logic circuits 330(1)-330 (N) are also provided as inputs to the array priority encoder 340, for example, as depicted in FIG. 3.

As mentioned above, the comparand line gating circuits 313(1)-313(N−1) are positioned between pairs of adjacent CAM blocks 311. More specifically, each of the comparand line gating circuits 313(1)-313(N−1) includes an input to receive the block match flag (BMF) generated by the match logic circuit 330 associated with a previous CAM block 311, and is configured to selectively connect the comparand line segments from the previous CAM block 311 to the comparand line segments in the corresponding adjacent CAM block 311 in response to the received BMF signal. For example, the comparand line gating circuit 313(1), which is positioned between adjacent CAM blocks 311(1) and 311(2), selectively connects the comparand line segments in the first CAM block 311(1) to the comparand line segments in the second CAM block 311(2) in response to match conditions in the first CAM block 311(1) indicated by the match flag BMF[1] generated by the first match logic circuit 330(1). Thus, for exemplary embodiments described herein, if there is not a match condition in the first CAM block 311(1) during a first compare phase, the comparand line gating circuit 313(1) connects the comparand line segments in the first CAM block 311(1) to the comparand line segments in the second CAM block 311(2), thereby providing the search key to the second CAM block 311(2) for a second compare phase. Conversely, if there is a match condition in the first CAM block 311(1) during the first compare phase, the comparand line gating circuit 313(1) does not connect the comparand line segments in the first CAM block 311(1) to the comparand line segments in the second CAM block 311(2), thereby reducing power consumption by not charging and/or discharging the comparand line segments in the second CAM block 311(2).

Thus, in accordance with the present embodiments, if a match condition is detected within a given CAM block 311(i) during search operations, the associated gating circuit 313(i) does not provide the search key to the next CAM block 311(i+1) or any subsequent CAM blocks 311. This is because if a match condition is detected in the CAM block 311(i), it is not necessary to search the lower-priority CAM blocks 311(i+1), 311(i+2), and so on for a match condition. Conversely, if a match condition is not detected in the CAM block 311(i), then the associated gating circuit 313(i) provides the search key to the next CAM block 311(i+1) for a next compare phase. If a match is detected in the next CAM block 311(i+1), then the search operation for the search key is complete. Otherwise, the search key is provided to the next CAM block 311 by the corresponding gating circuit 313, and so on. In this manner, search operations for the CAM device 300 can be performed in a number of iterative compare phases, thereby minimizing power consumption by driving the pair of complementary comparand line segments to opposite logic states (e.g., to embody the search key) only in selected CAM blocks 311.

Note that for each search operation with a given search key, the comparand line segments in the first CAM block 311(1) are typically driven by the comparand register 130, thereby enabling the first CAM block 311(1) for the search operation. Accordingly, data is stored in the CAM array 310 in descending order of priority such that any given CAM block 311(i) stores data having a higher priority than data stored in all subsequent CAM blocks 311(i+). Thus, for some embodiments, the search operation typically begins with only the first CAM block 311(1) enabled, and continues in subsequent CAM blocks 311(2)-311(N) only if necessary. For other embodiments, a plurality of CAM blocks 311 can be initially enabled for each search operation (e.g., by providing an asserted control signal to the match flag input of corresponding comparand line gating circuits 313).

Thus, a search operation performed in CAM device 300 includes a worst-case total of N compare phases and a best-case total of just one compare phase (e.g., if a match condition is detected in the first CAM block 311(1)). To account for differences between the worst-case and the best-case scenarios, well-known delay elements can be provided on various data paths within the CAM device 300 to synchronize the match results generated by the various CAM blocks 311 in corresponding sequential compare phases. For example, delay elements providing a delay of N time periods can be provided on the BPM[1] and BMF[1] data paths, delay elements providing a delay of N−1 time periods can be provided on the BPM[2] and BMF[2] data paths, and so on, where the time period corresponds to the duration of a compare phase performed in one of the CAM blocks 311. In this manner, CAM device 300 can be configured to perform multiple search operations in a pipelined manner (e.g., where different search keys are compared with data stored in different CAM blocks at the same time).

Figure 4:
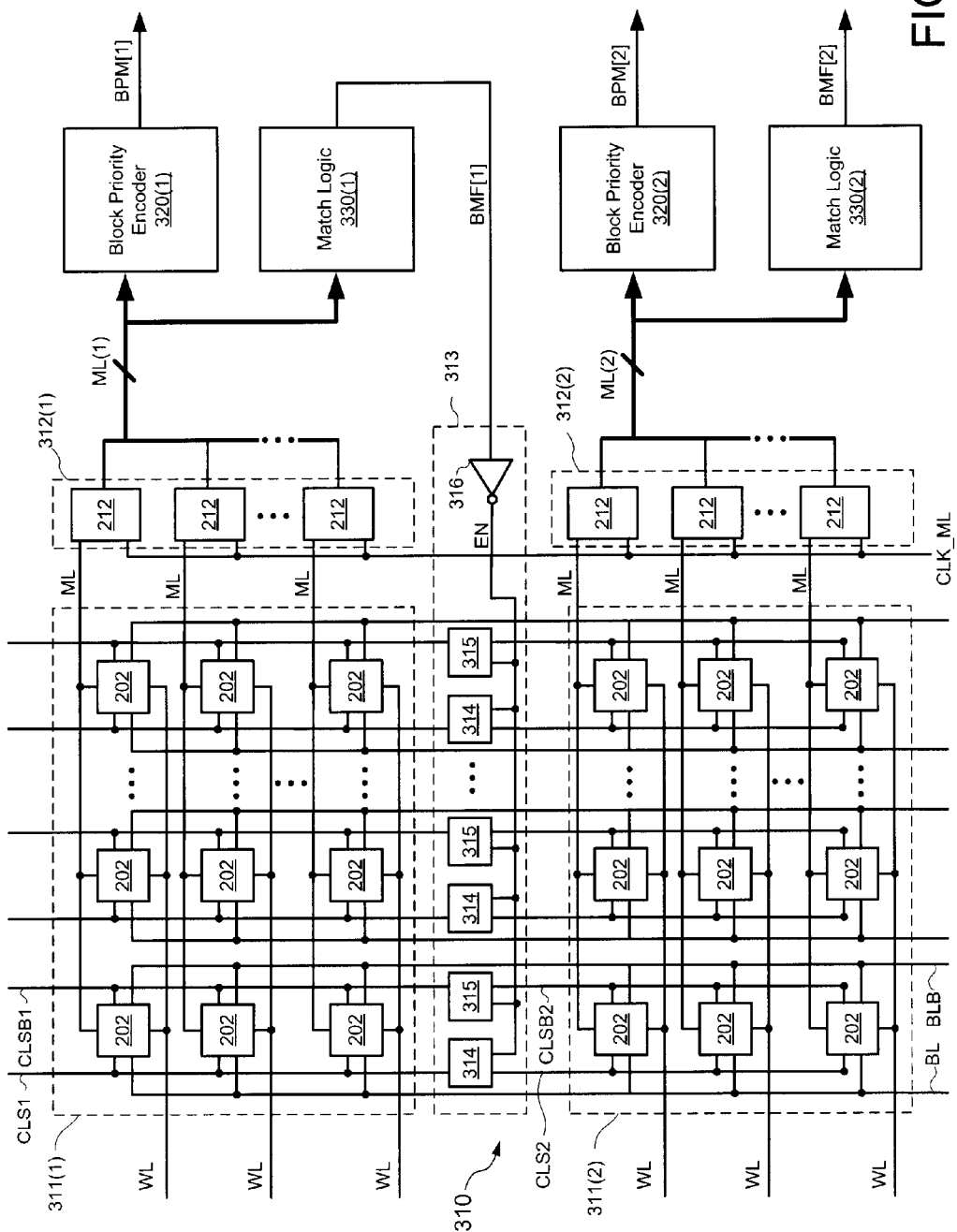
FIG. 4 shows a block diagram illustrating the CAM array of FIG. 3 in more detail.

FIG. 4 shows a more detailed block diagram of an exemplary embodiment of the CAM device 300 of FIG. 3. More specifically, FIG. 4 shows a portion of CAM array 310 including 2 CAM blocks 311(1) and 311(2), 2 corresponding match latch circuits 312(1) and 312(2), and an associated comparand line gating circuit 313. In addition, FIG. 4 shows a first pair of block priority encoder 320(i) and match logic circuit 330(1) associated with the first CAM block 311(1), and shows a second pair of block priority encoder 320(2) and match logic circuit 330(2) associated with the second CAM block 311(2).

CAM blocks 311(1) and 311(2) each include any number of rows and columns of CAM cells 202. The CAM cells 202 in each row are coupled to the address decoder 120 (not shown for simplicity) via a corresponding word line WL, and are coupled to an associated match latch 212 via a corresponding match line ML. The match latches 212, which collectively form the match latches 312 of FIG. 3, each include a control input to receive a match clock signal (CLK_ML), and each include an output to provide a latched match line signal to the corresponding block priority encoder 320 and match logic circuit 330. More specifically, the match results generated in the first CAM block 311(1) are provided to block priority encoder 320(1) and match logic circuit 330(1) on match lines ML(1) via match latches 212 in match latch circuit 312(1), and the match results generated in the second CAM block 311(2) are provided to block priority encoder 320(2) and match logic circuit 330(2) on match lines ML(2) via match latches 212 in match latch circuit 312(2). As noted above, each row may also include one or more validity bits (not shown for simplicity) indicating whether valid data is stored in the row.

The CAM cells 202 in each column are coupled to an associated pair of complementary comparand line segments CLS/CLSB. For example, each column of CAM cells in the first CAM block 311(1) are coupled to an associated pair of complementary comparand line segments CLS1/CLSB1 having first ends coupled to the comparand register 130 (not shown for simplicity) and having second ends coupled to inputs of the comparand line gating circuit 313, and each column of CAM cells in the second CAM block 311(2) are coupled to an associated pair of complementary comparand line segments CLS2/CLSB2 having first ends coupled to outputs of the comparand line gating circuit 313.

During compare operations, the comparand line gating circuit 313 selectively drives bits of the search key from the first CAM block 311(1) to the second CAM block 311(2) in response to match conditions in the first CAM block 311(1), as indicated by the logic state of the block match flag BMF[1]. Thus, for some embodiments, if there is a match condition in the first CAM block 311(1), match logic circuit 330(1) drives BMF[1] to logic high, which in turn allows the comparand line gating circuit 313 to forward the search key from the first CAM block 311(1) to the second CAM block 311(2). Conversely, if there is not a match condition in the first CAM block 311(1), match logic circuit 330(1) drives BMF[1] to logic low, which in turn prevents the comparand line gating circuit 313 from forwarding the search key from the first CAM block 311(1) to the second CAM block 311(2), thereby reducing power consumption by preventing compare operations between the search key and data stored in the second CAM block 311(2). More specifically, when a CAM block is disabled or otherwise prevented from participating in the compare operation, power consumption is reduces because (1) the match lines associated with the disabled CAM block are not discharged and then charged for the next compare operation, (2) the complementary compare line segments associated with the disabled CAM block are not driven to opposite logic states, and (3) clock power is reduced.

As shown in FIG. 4, the comparand line gating circuit 313 includes a number of pairs of comparand line gates 314-315, and a logical inverter 316. The inverter 316, which can be any suitable logical inversion circuit (e.g., a CMOS inverter circuit), includes an input to receive the block match flag BMF[1] from the first match logic circuit 330(1) and an output to generate an enable signal (EN) that is provided to the control inputs of gates 314 and 315. Each comparand line gate pair 314-315 is associated with a corresponding column of the CAM array 310, and selectively connects the comparand line segments in the first CAM block 311(1) to the comparand line segments in the second CAM block 311(2) in response to the EN signal. More specifically, for each column of the CAM array 310, a first comparand line gate 314 selectively connects the comparand line segment CLS1 of the first CAM block 311(1) to the comparand line segment CLS2 of the second CAM block 311(2) in response to EN, and a second comparand line gate 315 selectively connects the complementary comparand line segment CLSB1 of the first CAM block 311(1) to the complementary comparand line segment CLSB2 of the second CAM block 311(2) in response to EN. In this manner, the comparand lines CL/CLB in each column of the CAM array 310 are segmented by a corresponding pair of comparand line gates 314-315 along the CAM block boundary. The comparand line gates 314 and 315 can be any suitable logic gate or circuit that can selectively drive a bit of the search key from the first CAM block 311(1) to the second CAM block 311(2) in response to the enable signal EN.

An exemplary search operation of the embodiment depicted in FIG. 4 is described below. Prior to a search operation between a search key and data stored in the CAM array 310, the comparand line gating circuit 313 is disabled so that the comparand line segments CLS2/CLSB2 in the second CAM block 311(2) are not connected to the comparand line segments CLS1/CLSB1 in the first CAM block 311(1). Then, during the search operation, the search key is provided from the comparand register 130 to the first CAM block 311(1) via the first comparand line segments CLS1/CLSB1 and compared with data stored in the first CAM block 311(1). If there is match in the first CAM block 311(1), the match logic circuit 330(1) asserts (e.g., to logic high) the first block match flag BMF[1] to indicate the match condition. In response thereto, inverter 316 de-asserts the enable signal EN, which maintains the comparand line gates 314-315 in their disabled states, thereby preventing the search key from being propagated to the second CAM block 311(2). Thus, by not driving the comparand line segments CLS2/CLSB2 with the search key, power consumption is minimized.

If there is not a match in the first CAM block 311(1), the first match logic circuit 330(1) de-asserts (e.g., to logic low) the block match flag BMF[1]. In response thereto, inverter 316 asserts the enable signal EN (e.g., to logic high), which in turn enables the comparand line gating circuit 313. Once enabled, the comparand line gates 314-315 propagate the search key from the first CAM block 311(1) to the comparand line segments CLS2/CLSB2 in the second CAM block 311 (2), thereby allowing the search key to be compared with data stored in the second CAM block 311(2). Match results in the second CAM block 311(2) are then generated by the second match logic circuit 330(2).

For some embodiments, the block match flag signal BMF [1] generated by the first match logic circuit 330(i) can be used to selectively control other operations in the second CAM block 311(2) to further reduce power consumption. For example, for one embodiment, the first block match flag signal BMF[1] can be used to selectively control pre-charging of the match lines in the second CAM block 311(2) in response to match conditions in the first CAM block 311(1). More specifically, if there is a match condition in the first CAM block 311(1), then the resulting assertion of the match flag BMF[1] can be used to disable all pre-charge circuits (not shown for simplicity) associated with the match lines in the second CAM block 311(2), thereby reducing power consumption by not pre-charging the match lines in the second CAM block 311(2). Otherwise, if there is not a match in the first CAM block 311(1), then the resulting de-assertion of the match flag BMF[1] can be used to enable all pre-charge circuits associated with the match lines in the second CAM block 311(2).

Figure 5:
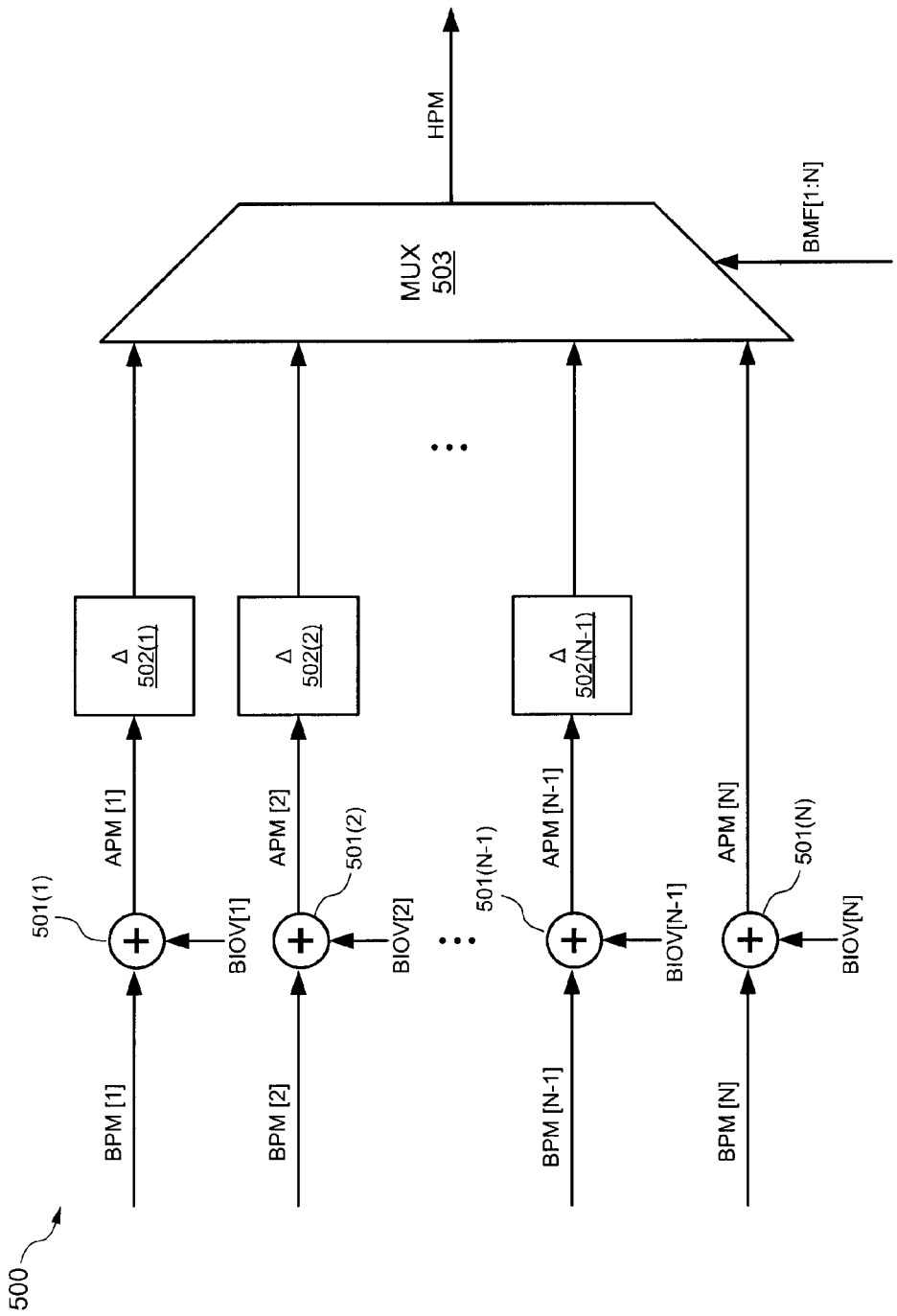
FIG. 5 shows a block diagram of one embodiment of the array priority encoder of FIG. 3.

FIG. 5 shows a block diagram of an array priority encoder 500 that is one embodiment of the array priority encoder 340 of FIG. 3. Array priority encoder 500 includes a number of adders 501(1)-501(N), a number of delay elements 502(1)-502(N-1), and multiplexer (MUX) 503. Adders 501(1)-501 (N) include first inputs to receive corresponding block priority match indices BPM[ ]-BPM[N], second inputs to receive respective block index offset values BIOV[1]-BIOV[N], and outputs to generate respective array priority match indices APM[1] to APM[N]. The array match indices APM[ ] to APM[N-1] are provided as inputs to respective delay elements 502(1)-502(N-1), which in turn provide delayed array priority match indices to corresponding inputs of the MUX 503. The last adder 501(N) provides the array priority match index APM[N] to the last input of MUX 503, which includes a control input to receive the block match flags BMF[1:N] and an output to generate the HPM index for the entire CAM array 310.

The BIOV signals are unique indices that are added to corresponding block priority match indices BPM[1]-BPM [N] to generate respective array priority match (APM) indices APM[ ]-APM[N]. More specifically, each BIOV indicates the block address of a corresponding one of the CAM blocks 311 and forms the most significant bits (MSBs) of the overall array priority match (APM) index, and each BPM index indicates the row address of a matching location within the associated CAM block 311 and forms the least significant bits (LSBs) of the overall array priority match (APM) index. Accordingly, the number of bits in the BIOV signals depends upon the number of CAM blocks 311 in the CAM array 310, and the number of bits in the BPM indices depends upon the number of rows in each of the CAM blocks 311.

Each of the delay elements 502(1)-502(N-1) provides an incrementally decreasing delay value between the corresponding adder circuit 501 and the MUX 503, with the first delay element 502(1) providing a largest delay value of $D_1=DP*(N-1)$, the second delay element 502(2) providing a next largest delay value of $D_2=DP*(N-2)$, and the last delay element providing a smallest delay value of $D_{N-1}=DP*(1)$, where DP is a predetermined delay period. For some embodiments, the delay period DP is the time period required to perform a compare phase in one of the CAM blocks 311. In this manner, the APM signals generated by various CAM blocks 311 at various points in pipelined compare operations arrive at the inputs of the MUX 503 at substantially the same time. Although not shown in FIG. 5 for simplicity, various delay elements may be similarly placed in the block match flag (BMF) data paths so that the signals BMF[1]-BMF[N] arrive at the control input of the MUX 503 at the same time. For other embodiments, delay elements 502 can be omitted, and the difference in delay between APM[ ] and APM[N] is maintained.

The MUX 503 decodes the block match flags BMF[1]-BMF[N] to select which one of the array priority match (APM) signals is provided as the HPM index for the CAM device 300. More specifically, the MUX 503 uses the asserted BMF to select the corresponding one of the APM signals generated by the CAM block 311 that generated the asserted BMF. For example, if only the signal BMF[2] generated by the second CAM block 3111(2) is asserted, which means that the matching row in the second CAM block 311(2) has the highest priority location in all of the CAM blocks 311 of the array 310, then the asserted state of BMF[2] causes the MUX 503 to output APM[2] as the device HPM index.

Figure 6:
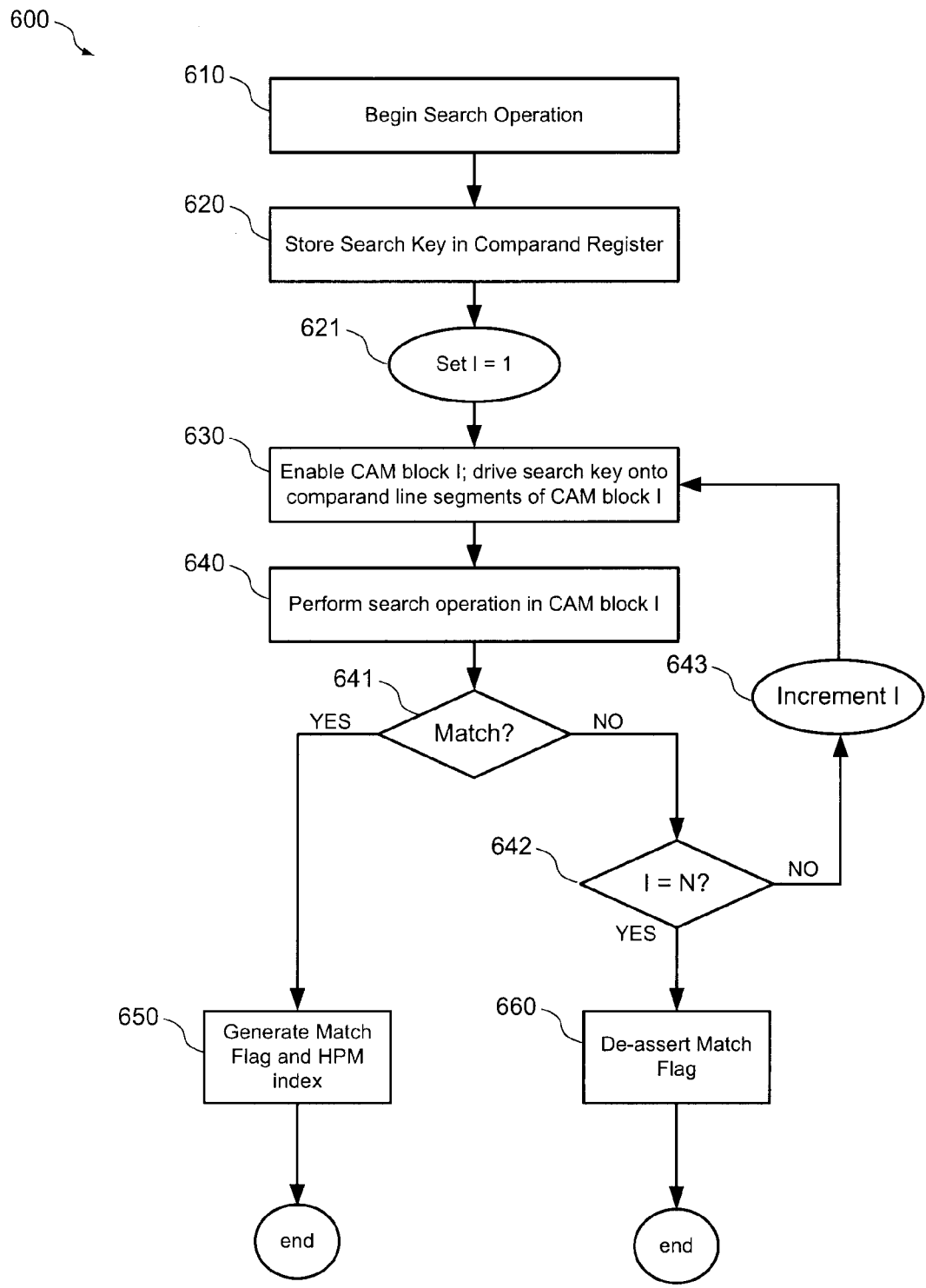
FIG. 6 is an illustrative flow chart depicting an exemplary search operation of a segmented CAM device according to some embodiments.

FIG. 6 is an illustrative flow chart depicting an exemplary search operation of a segmented CAM device according to one or more embodiments. Each search operation 600 is selectively performed in iterative phases or steps on successive cascaded CAM blocks 311(1)-311(N). As previously described, multiple search operations like search operation 600 may be performed at the same time on the segmented CAM device in a pipeline fashion.

At the beginning of the search operation, the search key is provided to the CAM device and stored in the comparand register 130 (610). Then, an iterative value (i) is initialized to i=1 (620). For exemplary embodiments described herein, the iterative value I indicates which of the vertically cascaded CAM blocks 311 is enabled for a next compare phase in which the search key is provided to and compared with data stored in that CAM block(s) 311. The iteration value i has maximum value N that is equal to the number of CAM blocks 311 in the CAM array 310.

In response to the current iteration value i=1, the first CAM block 311(1) is enabled for the first compare phase, and the sets of comparand line segments CLS1/CLSB1 in the first CAM block 311(1) are driven with corresponding bits of the search key (630). Then, the search key is compared with data stored in the first CAM block 311(1) to generate first match results (640). As mentioned above, the first CAM block 311 (1) is designated as the highest-priority CAM block, and therefore stores the highest-priority data in the CAM array. For some embodiments, enabling the first CAM block 311(1) may include other functions such as pre-charging match lines associated with CAM block 311(1).

If there is a match condition in the selected CAM block, as tested at 641, the match flag is asserted, and the HPM index for the matching entry is generated (650). Then, the search operation terminates because any other potentially matching locations in subsequent CAM blocks would be, by definition, of a lower priority.

Conversely, if there is not a match in the selected CAM block, at tested at 641, the search operation continues in the next CAM block 311($i$+1) if the previous CAM block 311($i$) was not the last CAM block in the segmented CAM array. Thus, if i<N, as tested at 642, then the iteration value i is incremented by 1 and the search operation continues for the next CAM block 311 (630). If i≧N, as tested at 642, which means the CAM block 311($i$) is the last CAM block in the segmented CAM array, the match flag is de-asserted to indicate the mismatch condition (660), and the search operation terminates.

Figure 7A:
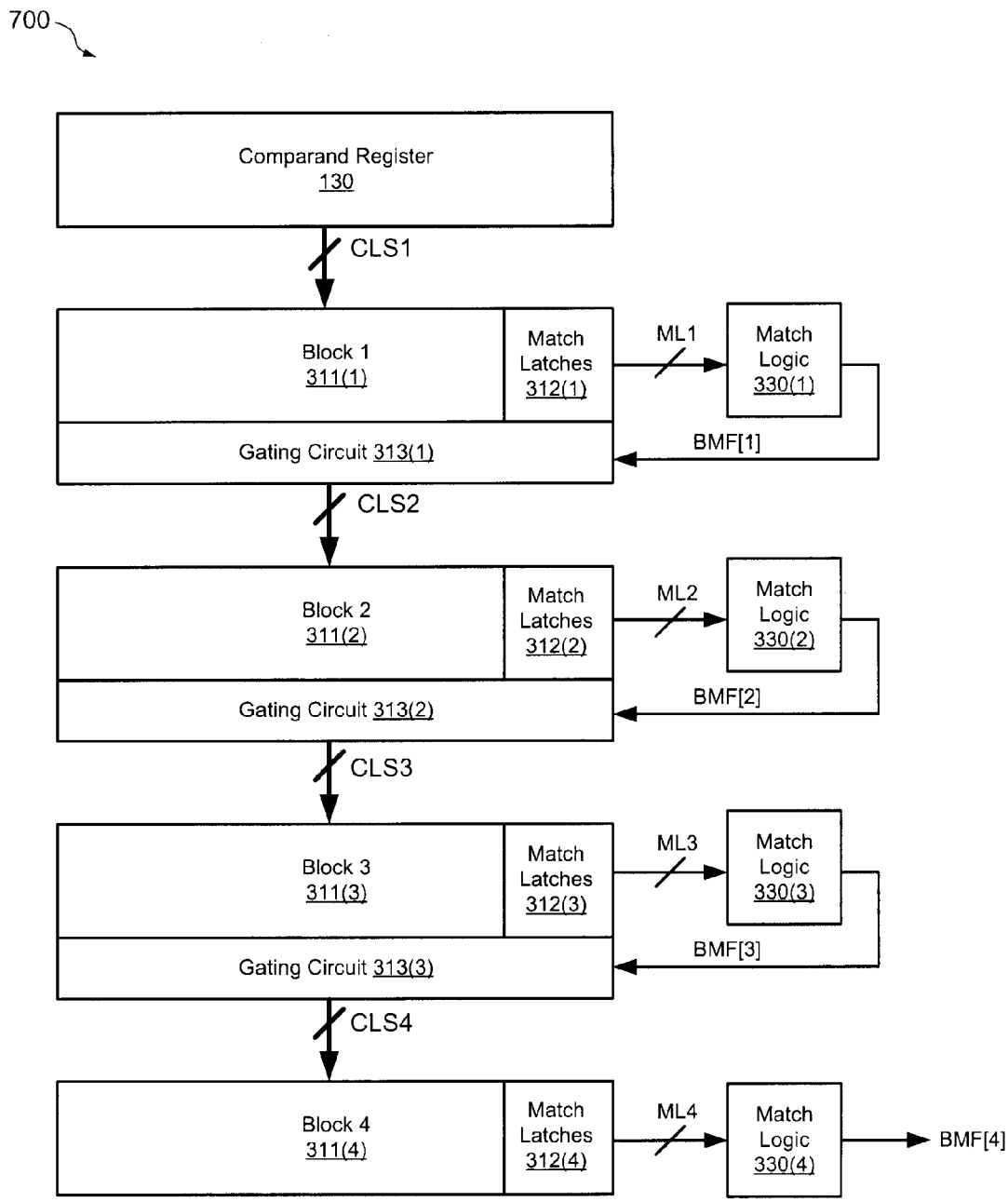
FIG. 7A shows a functional block diagram of a 4-segment CAM device according to one embodiment.

FIG. 7A shows a functional block diagram of a 4-segment CAM device 700 according to one embodiment. The 4-segmented CAM device 700 includes comparand register 130, an array having 4 CAM blocks 311(1)-311(4) and corresponding match latch circuits 312(1)-312(4), 4 corresponding match logic circuits 330(1)-330(4), and 3 associated comparand line gating circuits 313(1)-313(3). Other portions of the CAM device 700 are not shown in FIG. 7A for simplicity.

Comparand lines of CAM device 700 are segmented in accordance with embodiments described above. CAM device 700 includes four sets of comparand line segments CLS1, CLS2, CLS3, and CLS4, where the first set of comparand line segments CLS1 selectively provides the search key to the CAM cells (not shown for simplicity) in the first CAM block 311(1), the second set of comparand line segments CLS2 selectively provides the search key to the CAM cells (not shown for simplicity) in the second CAM block 311(2), the third set of comparand line segments CLS3 selectively provides the search key to the CAM cells (not shown for simplicity) in the third CAM block 311(3), and the fourth set of comparand line segments CLS4 selectively provides the search key to the CAM cells (not shown for simplicity) in the fourth CAM block 311(4). More specifically, the search key is selectively forwarded from the first CAM block 311(1) to the comparand line segments CLS2 in the second CAM block 311(2) by gating circuit 313(1) in response to match conditions in the first CAM block 311(1) indicated by BMF[1], the search key is selectively forwarded from the second CAM block 311(2) to the comparand line segments CLS3 in the third CAM block 311(3) by gating circuit 313(2) in response to match conditions in the second CAM block 311(2) indicated by BMF[2], and the search key is selectively forwarded from the third CAM block 311(3) to the comparand line segments CLS4 in the fourth CAM block 311(4) by gating circuit 313(3) in response to match conditions in the third CAM block 311(3) indicated by BMF[3].

Figure 7B:
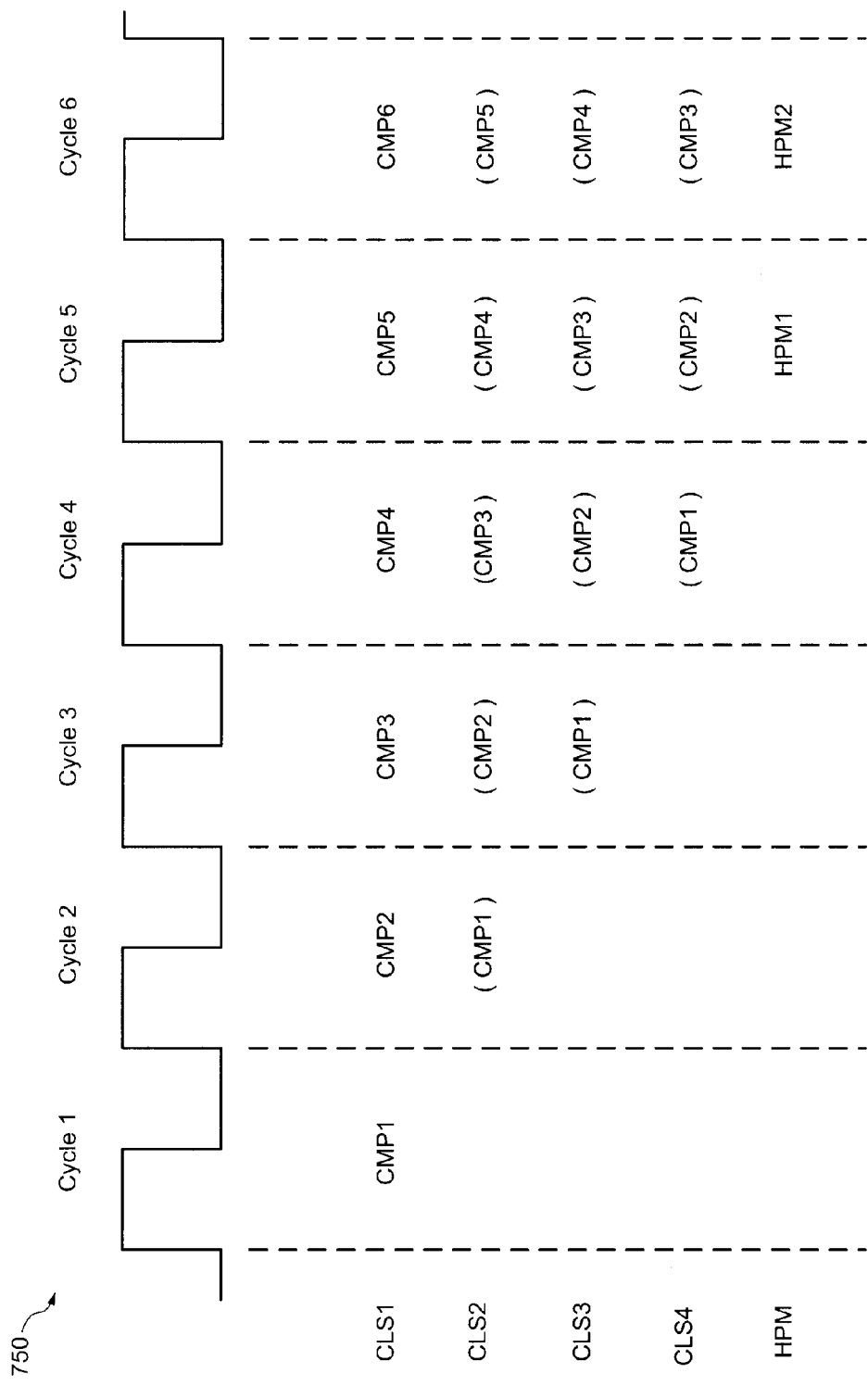
FIG. 7B depicts an illustrative timing diagram associated with search operations performed in the CAM device of FIG. 7A.

FIG. 7B illustrates a timing diagram of the CAM device of FIG. 7A performing search operations in a pipelined fashion. Timing diagram 750 illustrates 6 cycles of an exemplary search operation of CAM device 700. Each cycle corresponds to the time needed to perform a compare operation within one of the CAM blocks 311 of CAM device 700. Because CAM device 700 includes 4 CAM blocks, the search operation for CAM device 700 takes 4 cycles. The 4-segmented CAM device 700 is configured to simultaneously perform up to 4 search operations at once in a pipeline fashion.

A first search operation of the CAM device using a first comparand word CMP1 begins at Cycle 1, during which the comparand register 130 transmits CMP1 onto the first set of comparand line segments CLS1 associated with the first CAM block 311(1) for compare operations therein. All other sets of comparand line segments CLS2, CLS3, and CLS4 do not receive the comparand word at this time.

A second search operation using a second comparand word CMP2 begins at Cycle 2, during which comparand register 130 transmits CMP2 onto the first set of comparand line segments CLS1 associated with the first CAM block 311(1) for compare operations therein. Also during Cycle 2, comparand line gating circuit 313(1) selectively forwards CMP1 to the second set of comparand line segments CLS2 associated with the second CAM block 311(2) in response to match conditions in the first CAM block 311(1) during Cycle 2, as indicated by the match flag BMF[1]. Thus, if BMF[1] indicates a match condition for CMP1 in the first CAM block 311(1), the gating circuit 313(1) does not forward CMP1 to the second CAM block 311(2).

Conversely, if BMF[1] indicates a mismatch condition for CMP1 in the first CAM block 311(1), the gating circuit 313(1) forwards CMP1 to the second CAM block 311(2) for compare operations therein during the Cycle 2. In this manner, the first comparand word CMP1 is compared in the second CAM block 311(2) while the second comparand word CMP2 is compared in the first CAM block 311(1) during Cycle 2, thereby achieving multiple pipelined search operations at the same time in the CAM device.

The conditional forwarding of CMP1 to the second CAM block 311(2) during Cycle 2 is represented as "(CMP1)" in the timing diagram. Thus, as used therein, parentheses on the timing diagram represent the conditional forwarding of comparand word from a previous CAM block to a next CAM block.

A third search operation using a third comparand word CMP3 begins at Cycle 3, during which comparand register 130 transmits CMP3 onto the first set of comparand line segments CLS1 associated with the first CAM block 311(1) for compare operations therein. Also during Cycle 3, the second CAM block 311(2) is searched with CMP2 and the third CAM block 311(3) is searched with CMP1.

A fourth search operation using a fourth comparand word CMP4 begins at Cycle 4, during which comparand register 130 transmits CMP4 onto the first set of comparand line segments CLS1 associated with the first CAM block 311(1) for compare operations therein. Also during Cycle 4, the second CAM block 311(2) is searched with CMP3, the third CAM block 311(3) is searched with CMP2, and the fourth CAM block 311(4) is searched with CMP1.

A fifth search operation using a fifth comparand word CMP5 begins at Cycle 5, during which comparand register 130 transmits CMP5 onto the first set of comparand line segments CLS1 associated with the first CAM block 311(1) for compare operations therein. Also during Cycle 5, the second CAM block 311(2) is searched with CMP4, the third CAM block 311(3) is searched with CMP3, and the fourth CAM block 311(4) is searched with CMP2. Also during Cycle 5, the index HPM1 for the first search operation between CMP1 and data stored in all the CAM blocks is generated by the priority encoder. Processing continues in this manner to achieve numerous pipelined search operations in the CAM device at the same time.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A content addressable memory (CAM) device comprising:
   a plurality of CAM blocks, each block including a number of rows of CAM cells and a set of comparand line segments extending across the rows of CAM cells within the CAM block; and
   a number of comparand line gating circuits, each to selectively connect the set of comparand line segments in a previous CAM block to the set of comparand line segments in a next CAM block in response to match conditions in the previous CAM block, wherein each comparand line gating circuit provides a search key from the previous CAM block to the next CAM block only if there is not a match condition in the previous CAM block.

2. The CAM device of claim 1, wherein each comparand line gating circuit does not provide the search key from the previous CAM block to the next CAM block if there is a match condition in the previous CAM block.

3. The CAM device of claim 1, further comprising:
   a plurality of match logic circuits, each having a number of inputs to receive match results from a corresponding CAM block and having an output to generate a match flag indicative of a match condition in the corresponding CAM block, wherein each comparand line gating circuit includes an input to receive the match flag corresponding to the previous CAM block.

4. The CAM device of claim 3, further comprising:
   a plurality of block priority encoder circuits, each having a number of inputs to receive match results from a corresponding CAM block and having an output to generate an index of the highest-priority matching (HPM) location in the corresponding CAM block; and
   an array priority encoder circuit having a number of inputs to receive the block HPM indices from the block priority encoder circuits and having an output to generate an array HPM index.

5. The CAM device of claim 4, wherein the array priority encoder circuit further includes control inputs to receive the match flags from the block priority encoder circuits.

6. The CAM device of claim 5, wherein the match flags select which of the block HPM indices is selected for output as the array HPM index.

7. The CAM device of claim 4, wherein the array priority encoder circuit comprises:
   a plurality of adder circuits, each having a first input to receive the HPM index from a corresponding CAM block, a second input to receive a unique block index offset value, and an output; and
   a multiplexer having a number of inputs each coupled to the output of a corresponding adder circuit, a control input to receive match flags indicative of match results in the CAM blocks, and an output to generate the array HPM index.

8. The CAM device of claim 7, wherein the array priority encoder circuit further comprises:
   a number of delay elements, each coupled between the multiplexer and the output of a corresponding one of the adder circuits, wherein each delay element provides an incrementally decreasing delay value between the multiplexer and the corresponding adder circuit.

9. The CAM device of claim 1, wherein each comparand line gating circuit comprises:
   a number of gates, each having an input coupled to the comparand line segment in a corresponding column of the previous CAM block, an output coupled to the comparand line segment in a corresponding column of the next CAM block, and a control input to receive a match flag indicative of match results in the previous CAM block.

10. A content addressable memory (CAM) device configured to compare a search key with data in an array of CAM cells, the CAM array comprising:
    a first CAM block including a plurality of CAM cells arranged in a number of rows and columns, and having a set of first comparand line segments each connecting the CAM cells in a corresponding column of the first CAM block;
    a second CAM block including a plurality of CAM cells arranged in a number of rows and columns, and having a set of second comparand line segments each connecting the CAM cells in a corresponding column of the second CAM block; and
    a comparand line gating circuit configured to selectively drive the search key from the set of first comparand line segments in the first CAM block to the set of second comparand line segments in the second CAM block in response to match conditions in the first CAM block, wherein the comparand line gating circuit forwards the search key from the first CAM block to the second CAM block only if there is not a match condition in the first CAM block.

11. The CAM device of claim 10, wherein the comparand line gating circuit does not forward the search key from the first CAM block to the second CAM block if there is a match condition in the first CAM block.

12. The CAM device of claim 10, further comprising:
    a match logic circuit coupled to the first CAM block and configured to generate a match flag indicative of match conditions in the first CAM block, wherein the comparand line gating circuit includes an input to receive the match flag.

13. The CAM device of claim 12, further comprising:
    a first block priority encoder circuit having a number of inputs to receive match results from the first CAM block and having an output to generate an index of the highest-priority matching (HPM) location in the first CAM block;
    a second block priority encoder circuit having a number of inputs to receive match results from the second CAM block and having an output to generate an index of the highest-priority matching (HPM) location in the second CAM block; and an array priority encoder circuit having a number of inputs to receive the first and second block HPM indices and having an output to generate an array HPM index.

14. The CAM device of claim 13, wherein the array priority encoder circuit further includes a control input to receive the match flag.

15. The CAM device of claim 14, wherein the match flag selects which of the block HPM indices is selected for output as the array HPM index.

* * * * *